(12) United States Patent
Tao

(10) Patent No.: US 10,287,491 B2
(45) Date of Patent: May 14, 2019

(54) COATED MANGANESE-ACTIVATED COMPLEX FLUORIDE PHOSPHORS

(71) Applicant: Intematix Corporation, Fremont, CA (US)

(72) Inventor: Dejie Tao, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 15/463,746

(22) Filed: Mar. 20, 2017

(65) Prior Publication Data

US 2017/0275529 A1 Sep. 28, 2017

Related U.S. Application Data

(60) Provisional application No. 62/311,542, filed on Mar. 22, 2016.

(51) Int. Cl.
| | |
|---|---|
| *C09K 11/02* | (2006.01) |
| *H01L 33/50* | (2010.01) |
| *C09K 11/66* | (2006.01) |
| *C09K 11/61* | (2006.01) |
| *C09K 11/67* | (2006.01) |

(52) U.S. Cl.
CPC .......... *C09K 11/025* (2013.01); *C09K 11/617* (2013.01); *C09K 11/665* (2013.01); *C09K 11/675* (2013.01); *H01L 33/504* (2013.01); *H01L 2224/48091* (2013.01); *H01L 2224/48257* (2013.01); *H01L 2224/49107* (2013.01); *H01L 2224/73265* (2013.01); *H01L 2924/181* (2013.01)

(58) Field of Classification Search
CPC .......... H01L 2924/00; H01L 2924/181; H01L 2924/00014; C09K 11/025
USPC ..................... 438/26; 257/E21.599, E33.059
See application file for complete search history.

(56) References Cited

U.S. PATENT DOCUMENTS

| | | | |
|---|---|---|---|
| 2008/0180803 A1* | 7/2008 | Seybert .............. | C09D 201/005 359/642 |
| 2011/0068321 A1* | 3/2011 | Pickett ................. | C09K 11/025 257/13 |
| 2011/0147664 A1* | 6/2011 | Lyons .................. | C09K 11/025 252/301.36 |
| 2015/0299348 A1* | 10/2015 | Hikmet ..................... | G02B 1/04 257/98 |
| 2016/0133799 A1* | 5/2016 | Park ....................... | H01L 33/502 257/98 |

* cited by examiner

*Primary Examiner* — Jonathan Han
(74) *Attorney, Agent, or Firm* — CrossPond Law

(57) ABSTRACT

A coated phosphor comprises phosphor particles, wherein said phosphor particles comprise manganese-activated complex fluoride phosphors; and a coating on individual ones of said phosphor particles, said coating comprising a layer of carboxylic acid material encapsulating the individual phosphor particles.

12 Claims, 4 Drawing Sheets

COATED MANGANESE-ACTIVATED COMPLEX FLUORIDE PHOSPHORS

CROSS-REFERENCE TO RELATED APPLICATIONS

This application claims the benefit of priority to U.S. Provisional Application No. 62/311,542, filed Mar. 22, 2016, which is hereby incorporated by reference in its entirety.

FIELD OF THE INVENTION

Embodiments of the present invention are directed to manganese-activated complex fluoride phosphors coated with organic molecules, and light emitting devices including the same.

BACKGROUND OF THE INVENTION

Manganese-activated complex fluoride phosphors such as $K_2TiF_6:Mn^{4+}$, $K_2SiF_6:Mn^{4+}$ and $K_2GeF_6:Mn^{4+}$ have poor reliability (stability), resulting in reduction of brightness and shift in CIE coordinates over prolonged periods of operation (typically, 100's of hours of use). Clearly, there is a need for KSF coatings which are effective at protecting such phosphor particles from moisture and oxygen thereby improving the brightness and reducing the shift in CIE coordinates over prolonged use so as to provide a commercially useful phosphor.

SUMMARY OF THE INVENTION

A coated phosphor can comprise: phosphor particles, wherein the phosphor particles comprise manganese-activated complex fluoride phosphors; and a coating on individual ones of the phosphor particles, the coating comprising a carboxylic acid material encapsulating the individual phosphor particles. The carboxylic acid material can be provided, e.g., as a layer encapsulating the individual phosphor particles. In some embodiments, the coating on individual ones of said phosphor particles can comprise multiple layers of different carboxylic acids. Alternatively and/or in combination, the carboxylic acid material can comprise mixed carboxylic acids.

A method of forming a coated phosphor can comprise, e.g.: providing phosphor particles, wherein the phosphor particles are comprised of manganese-activated complex fluoride phosphors; and depositing a coating on individual ones of the phosphor particles by a liquid phase process, the coating comprising a carboxylic acid material encapsulating the individual phosphor particles. The method can include the step of providing the carboxylic acid material as a layer encapsulating the individual phosphor particles. In some embodiments, the method can include the step of depositing the carboxylic acid material as a layer encapsulating the individual phosphor particles. In some embodiments, the method can include the step of depositing the carboxylic acid material which comprises depositing mixed carboxylic acids. In some embodiments, the method can involve depositing said coating on individual ones of said phosphor particles which comprises the step of providing multiple layers of different carboxylic acids.

A white light emitting device can comprise, e.g.: an excitation source with emission wavelength within a range from 200 nm to 480 nm; a coated phosphor as described herein with a first phosphor peak emission wavelength; and a second phosphor with a second phosphor peak emission wavelength different to said first phosphor peak wavelength.

A white light emission device for backlighting can comprise, e.g.: an excitation source with emission wavelength within a range from 440 nm to 480 nm; a coated phosphor as in claim 1 with a first phosphor peak emission wavelength between about 600 nm and about 650 nm; and a second phosphor with a second phosphor peak emission wavelength different to said first phosphor peak wavelength, said second phosphor peak emission wavelength being between about 520 nm and about 545 nm. It may be that the white light emission device has an emission spectrum with clearly separated blue, green and red peaks.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
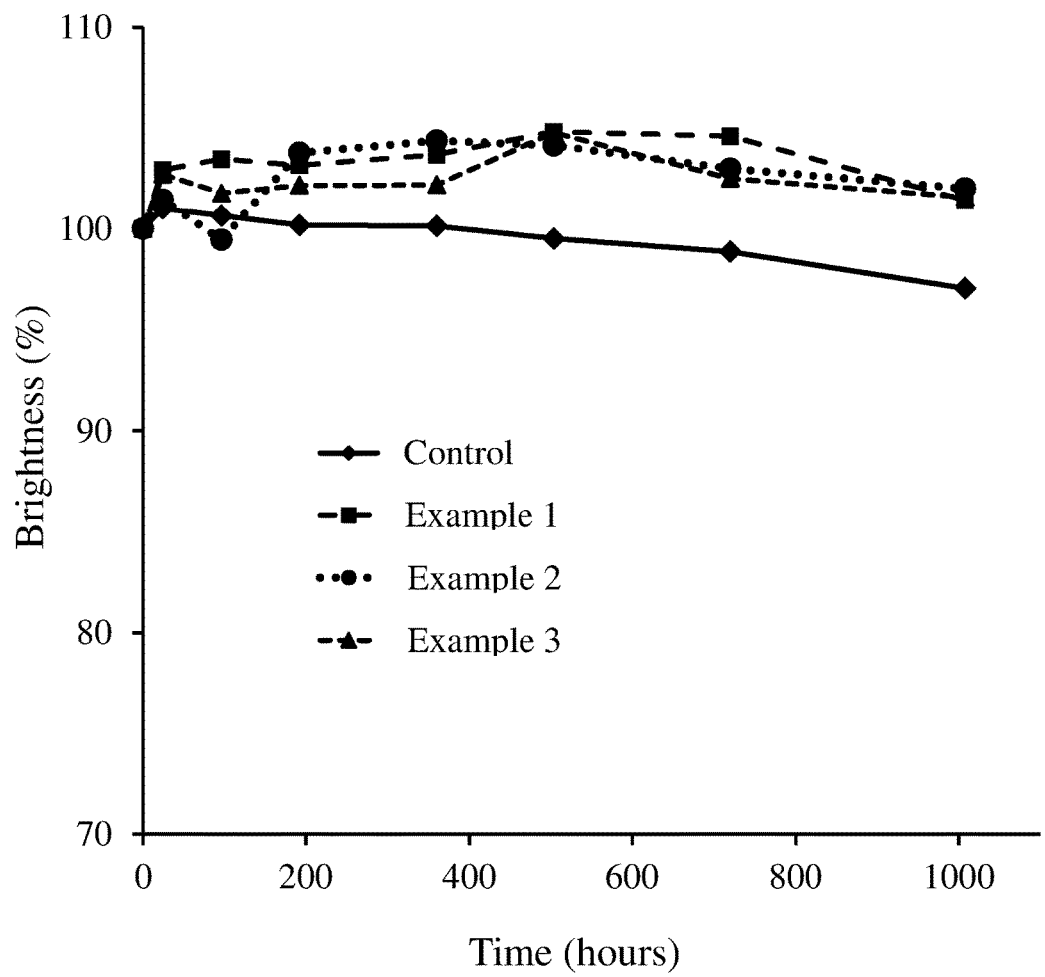
FIG. 1 shows reliability data, photoluminescence intensity (brightness) versus time, for a 7020 LED operated under RTOL (Room Temperature Operating Life) test conditions at 25° C. and 120 mA for i) KSF control, ii) Example 1—KSF coated with docsanoic acid, according to an embodiment of the invention, iii) Example 2—KSF coated with octacosanoic acid, according to an embodiment of the invention, and iv) Example 3—KSF coated with stearic acid, according to an embodiment of the invention.
Figure 2:
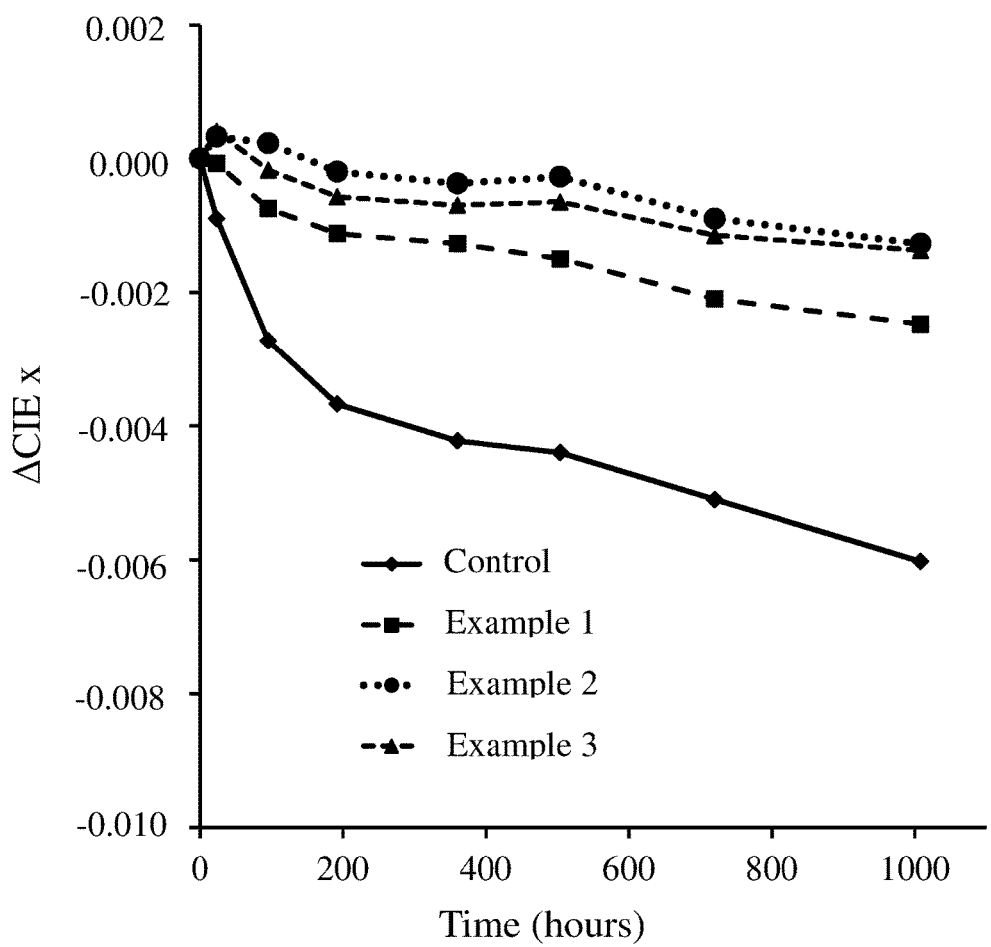
FIG. 2 shows reliability data, change of chromaticity Δ CIE x versus time, for a 7020 LED operated under RTOL conditions at 25° C. and 120 mA for i) KSF control, ii) Example 1—KSF coated with docsanoic acid, according to an embodiment of the invention, iii) Example 2—KSF coated with octacosanoic acid, according to an embodiment of the invention, and iv) Example 3—KSF coated with stearic acid, according to an embodiment of the invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

As described below, the inventor has found that manganese-activated complex fluoride phosphors such as $K_2TiF_6$:$Mn^{4+}$, $K_2SiF_6$:$Mn^{4+}$ and $K_2GeF_6$:$Mn^{4+}$ may advantageously be coated using a carboxylic acid material to improve the stability and reliability of the phosphor by protecting the phosphor particles from moisture and oxygen. It is expected by the inventor that the hydrophilic ends of the carboxylic acid molecules will attach to the phosphor particle surface whereby the hydrophilic ends of the molecules will be on the outside of the coating, thus providing protection against moisture. Furthermore, the inventor expects the carboxylic acid coatings to be superior to coatings with materials such as carboxylic salts, particularly salts comprising alkali or alkaline earth metals, for applications in which the coated phosphor is embedded in a silicone material in an LED package; the inventor believes the metal ions in carboxylic salts would interfere with the curing of the silicone adhesive, whereas the phosphor particles coated with carboxylic acid do not introduce unwanted metal ions into the silicone and the curing of the phosphor loaded silicone is unimpaired.

EXAMPLES

The examples of different phosphors set forth herein below are illustrative of different compositions and conditions that can be used in practicing the present embodiments. It will be apparent, however, that the present embodiments can be practiced with many types of compositions and configurations in accordance with the disclosure above and as pointed out hereinafter.

Comparative Example

An uncoated $K_2SiF_6$:$Mn^{4+}$ phosphor control—also used for testing the different coatings—can be fabricated as follows. A first solution of $H_2SiF_6$ (34.5% wt, 137 g) and $K_2MnF_6$ (4.34 g) in 49% aqueous HF (300 ml) was prepared at room temperature. A second solution containing KF (180 g) in 49% HF (900 ml) was prepared at room temperature. The second solution was then added to the first solution with stirring and $K_2SiF_6$:$Mn^{4+}$ phosphor was precipitated. The precipitate was washed with acetone to remove any residual HF and then vacuum filtered and dried.

Examples 1-3

Examples 1 to 3 were prepared by stirring $K_2SiF_6$:$Mn^{4+}$ (KSF) powder, obtained by the procedure described above for the Comparative Example, with one of the following carboxylic acids dissolved in acetone: docosanoic acid for Example 1, octacosanoic acid for Example 2 and stearic acid for Example 3, according to the following procedure. Bake the KSF powder at 130° C. until completely dry. Prepare the carboxylic acid solution, with the amounts provided in Table 1, and place the solution in a beaker. Add KSF powder into the carboxylic acid/acetone solution and stir for approximately 2 hours. Vacuum filter the solution containing the coated KSF powder until dry powder is obtained. Bake the coated KSF powder at 130° C. for approximately 2 hours. Wash the coated KSF powder with acetone after baking, vacuum filter until dry, and then bake the coated KSF powder at 130° C. for approximately 2 hours.

TABLE 1

Amounts of materials for preparation of the different coated phosphors of Examples 1-3

| | KSF (g) | Docosanoic acid(g) | Octacosanoic acid (g) | Stearic acid (g) | Acetone (ml) |
|---|---|---|---|---|---|
| Ex. 1 | 20 | 0.4 | — | — | 100 |
| Ex. 2 | 20 | — | 0.07 | — | 100 |
| Ex. 3 | 20 | — | — | 1.25 | 100 |

The coated KSF phosphor particles were tested using an Ocean Optics USB4000 spectrometer for photoluminescence intensity (PL) and chromaticity (CIE coordinates x and y). It was found that there is no significant peak emission position or color (CIE) change after coating the KSF particles. The PL (relative photo luminance intensity) for the coated samples is also not reduced after coating but actually increases with time, which results in a brightness increase compared to the uncoated Control sample as shown in FIG. 1.

Figure 3:
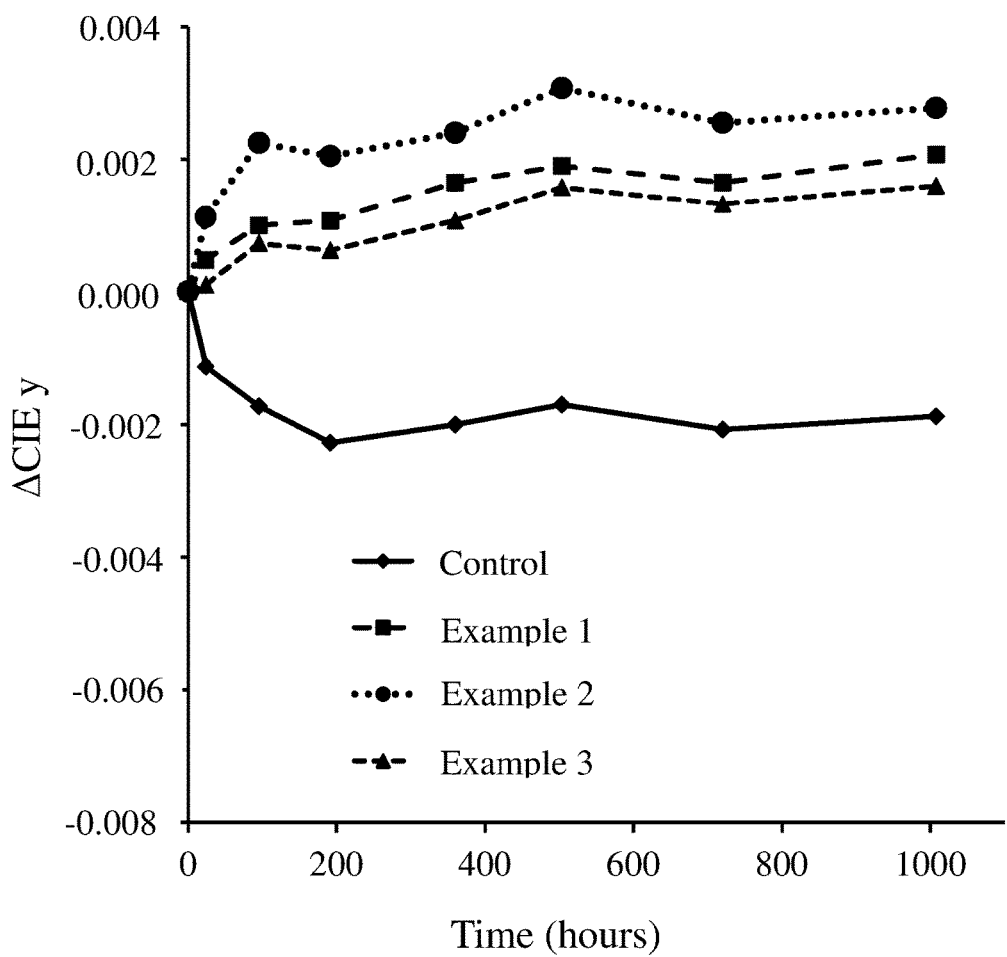
FIG. 3 shows reliability data, change of chromaticity Δ CIE y versus time, for a 7020 LED operated under RTOL conditions at 25° C. and 120 mA for i) KSF control, ii) Example 1—KSF coated with docsanoic acid, according to an embodiment of the invention, iii) Example 2—KSF coated with octacosanoic acid, according to an embodiment of the invention, and iv) Example 3—KSF coated with stearic acid, according to an embodiment of the invention.
Figure 4:
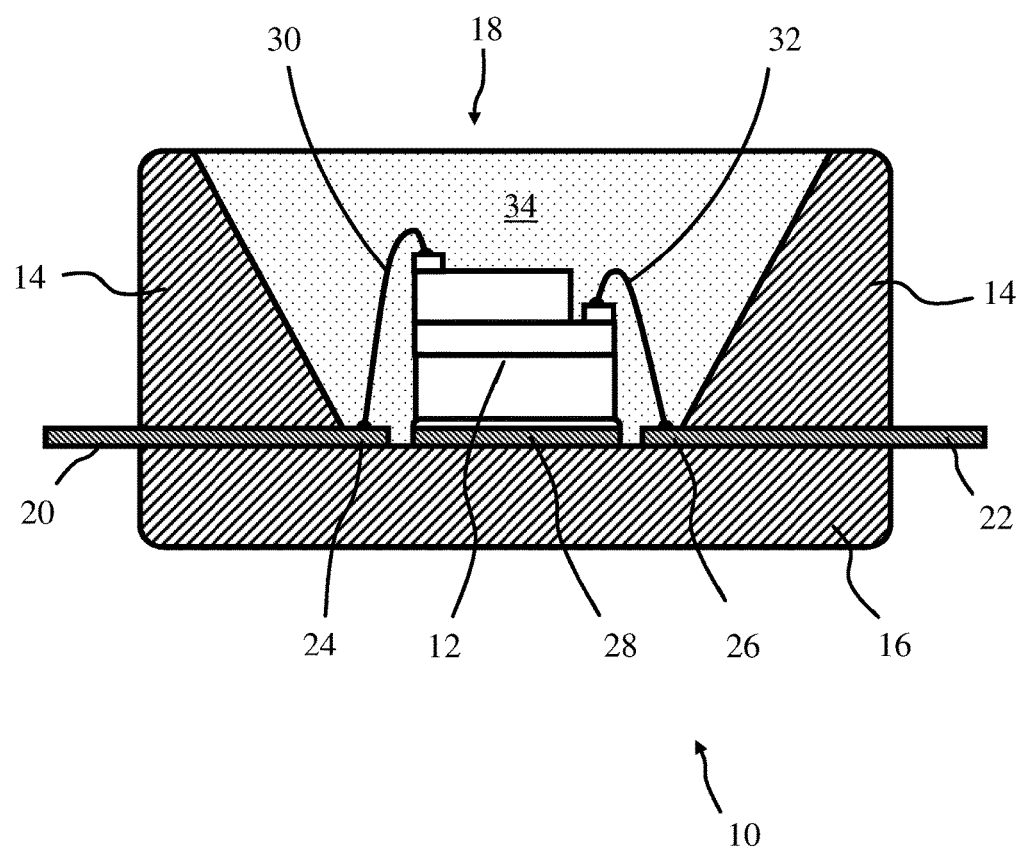
FIG. 4 is a schematic representation of a white light emitting device, according to some embodiments.

The plot of Δ CIE x versus time and Δ CIE y versus time in FIGS. 3 & 4 show the coated samples have a much smaller shift in CIE y color coordinate compared with the uncoated Control sample.

The plot of Δ CIE y versus time in FIG. 3 shows the coated samples have a similar shift in the CIE y color coordinate with time to the uncoated Control sample, albeit in the opposite direction.

Packaged White Light Emitting Device, for Display Backlight and General Lighting Device FIG. 4 illustrates a white light emitting device, according to some embodiments. The device 10 can comprise a blue light emitting LED chip 12, for example a GaN-based LED chip with a dominant emission wavelength within the range of 450 nm to 470 nm, housed within a package. The package, which can for example comprise a low temperature co-fired ceramic (LTCC) or high temperature polymer, comprises upper and lower body parts 14, 16. The upper body part 14 defines a recess 18, often circular in shape, which is configured to receive the LED chip(s) 12. The package further comprises electrical connectors 20 and 22 that also define corresponding electrode contact pads 24 and 26 on the floor of the recess 18. Using adhesive or solder, the LED chip(s) 12 can be mounted to a thermally conductive pad 28 located on the floor of the recess 18. The LED chip's electrode pads are electrically connected to corresponding electrode contact pads 24 and 26 on the floor of the package using bond wires 30 and 32 and the recess 18 is filled with a mixture of a transparent polymer material 34, typically a silicone, loaded with the manganese-activated complex fluoride phosphor of the present invention and a green/yellow phosphor such that the exposed surfaces of the LED chip 12 are covered by the polymer/phosphor material mixture. To enhance the emission brightness of the device the walls of the recess are inclined and can have a light reflective surface.

Furthermore, it is expected that the performance of some embodiments of the coated narrow band red phosphors (manganese-activated complex fluoride phosphors) of the present invention in combination with one of the various possible narrow band green phosphors will provide higher efficiencies and higher levels of color gamut compared with red nitride phosphors such as $(Ba,Sr)_2Si_5N_8:Eu^{2+}$ or $(Ca,Sr)AlSiN_3:Eu^{2+}$ in combination with the same narrow band green phosphors.

Furthermore, in embodiments the coated phosphors of the present invention can be used in high CRI (color rendering index) white light applications when used in combination with a broad band red emitting phosphor such as $Eu^{2+}$ or $Ce^{3+}$ doped (oxy)nitride compounds, for example $(Ba,Sr)_2Si_5N_8:Eu^{2+}$ and $(Ca,Sr)AlSiN_3:Eu^{2+}$.

Furthermore, in embodiments the coated phosphors of the present invention can be used in white light emission devices used as backlights for displays, wherein the white light emission device has an emission spectrum with clearly separated blue, green and red peaks.

Although the present invention has been described with reference to coating of KSF phosphor particles by only 3 specific carboxylic acids, the carboxylic acids listed in Table 2 may also be used for coating and are expected to provide similar improvements in the stability and reliability as demonstrated for Examples 1-3.

TABLE 2

Candidate carboxylic acids for coating of KSF phosphor material.

| $H_3C$—(R)—$CO_2H$ | Systematic names | Trivial names |
|---|---|---|
| —[$CH_2$]$_8$— | Decano- | Capr-$^c$ |
| —[$CH_2$]$_{10}$— | Dodecano- | Laur- |
| —[$CH_2$]$_{12}$— | Tetradecano- | Myrist- |
| —[$CH_2$]$_{14}$— | Hexadecano- | Palmit- |
| —[$CH_2$]$_5$CH=CH[$CH_2$]$_7$— | 9-Hexadeceno- | Palmitole- |
| —[$CH_2$]$_{16}$— | Octadecano- | Stear- |
| —[$CH_2$]$_7$CH=CH[$CH_2$]$_7$— | cis-9-Octadeceno- | Ole- |
| —[$CH_2$]$_5$CH=CH[$CH_2$]$_9$— | 11-Octadeceno- | Vaccen- |
| —[$CH_2$]$_3$($CH_2$CH=CH)$_2$[$CH_2$]$_7$— | cis,cis-9,12,-Octadecadieno- | Linole |
| —($CH_2$CH=CH)$_3$[$CH_2$]$_7$— | 9,12,15-Octadecatrieno- | (9,12,15)-Linolen- |
| —[$CH_2$]$_3$($CH_2$CH=CH)$_3$[$CH_2$]$_4$— | 6,9,12-Octadecatrieno- | (6,9,12)-Linolen- |
| —[$CH_2$]$_3$(CH=CH)$_3$[$CH_2$]$_7$— | 9,11,13-Octadecatrieno- | Eleostear- |
| —[$CH_2$]$_{18}$— | Icosano-$^d$ | Arachid- |
| —[$CH_2$]$_6$($CH_2$CH=CH)$_2$[$CH_2$]$_6$— | 8,11-Icosadieno-$^d$ | |
| —[$CH_2$]$_6$($CH_2$CH=CH)$_3$[$CH_2$]$_3$— | 5,8,11-Icosatrieno-$^d$ | |
| —[$CH_2$]$_3$($CH_2$CH=CH)$_4$[$CH_2$]$_3$— | 5,8,11,14-Icosatetraeno-$^d$ | Arachidon- |
| —[$CH_2$]$_{20}$— | Docosano- | Behen- |
| —[$CH_2$]$_{22}$— | Tetracosano- | Lignocer- |
| —[$CH_2$]$_7$CH=CH[$CH_2$]$_{13}$— | cis-15-Tetracoseno- | Nervon- |
| —[$CH_2$]$_{24}$— | Hexacosano- | Cerot- |
| —[$CH_2$]$_{26}$— | Octacosano- | Montan- |

Although examples of the present invention have been described with reference to KSF phosphor particles coated with a single carboxylic acid, in certain embodiments, it is envisaged that the coatings comprise multiple layers with combinations of the coating materials described herein (the coating on individual ones of said phosphor particles can comprise multiple layers of different carboxylic acids), or layers can comprise mixed carboxylic acids (the carboxylic acid material may comprise mixed carboxylic acids). The carboxylic acid material can be provided as a layer encapsulating the individual phosphor particles.

Although the present invention has been particularly described with reference to examples of coated KSF phosphors, it is expected that the teaching and principles of the present invention will apply more generally to manganese-activated complex fluoride phosphors, including $K_2TiF_6:Mn^{4+}$ and $K_2GeF_6:Mn^{4+}$.

Although the present invention has been particularly described with reference to certain embodiments thereof, it should be readily apparent to those of ordinary skill in the art that changes and modifications in the form and details can be made without departing from the spirit and scope of the invention.

What is claimed is:

1. A coated phosphor comprising:
   phosphor particles, wherein said phosphor particles comprise a manganese-activated complex fluoride phosphor; and
   a coating on individual ones of said phosphor particles, said coating comprising at least one carboxylic acid material layer encapsulating the individual phosphor particles;
   wherein at least one said carboxylic acid material layer comprises mixed carboxylic acids.

2. The coated phosphor of claim 1, wherein said coating on individual ones of said phosphor particles comprises multiple layers of different carboxylic acids.

3. The coated phosphor of claim 1, wherein said phosphor particles comprise $K_2SiF_6:Mn^{4+}$.

4. The coated phosphor of claim 1, wherein said phosphor particles comprise $K_2TiF_6:Mn^{4+}$.

5. The coated phosphor of claim 1, wherein said phosphor particles comprise $K_2GeF_6:Mn^{4+}$.

6. The coated phosphor of claim 1, wherein said coating is docosanoic acid.

7. The coated phosphor of claim 1, wherein said coating is octacosanoic acid.

8. The coated phosphor of claim 1, wherein said coating is stearic acid.

9. A white light emitting device comprising:
   an excitation source with emission wavelength within a range from 200 nm to 480 nm;
   a coated phosphor as in claim 1 with a first phosphor which emits light with a photoluminescence peak emission wavelength between about 600 nm and about 650 nm; and
   a second phosphor being a green or yellow-emitting phosphor having a peak emission wavelength between about 515 nm and about 570 nm.

10. The white light emitting device of claim 9, wherein said phosphor particles comprise $K_2SiF_6:Mn^{4+}$ and said coating is one or more materials chosen from the group consisting of docosanoic acid, octacosanoic acid, and stearic acid.

11. A white light emission device for backlighting, comprising:
    an excitation source with emission wavelength within a range from 440 nm to 480 nm;
    a coated phosphor as in claim 1 with a first phosphor peak emission wavelength between about 600 nm and about 650 nm; and
    a second phosphor with a second phosphor peak emission wavelength different to said first phosphor peak wavelength, said second phosphor peak emission wavelength being between about 520 nm and about 545 nm.

12. The white light emitting device of claim 11, wherein said phosphor particles are comprised of $K_2SiF_6:Mn^{4+}$ and said coating is one or more materials chosen from the group consisting of docosanoic acid, octacosanoic acid, and stearic acid.

* * * * *